United States Patent [19]

Gilmore

[11] Patent Number: 5,113,102
[45] Date of Patent: May 12, 1992

[54] ROTARY MOTION TRANSMITTER AND HEAT TREATMENT METHOD FOR SEALED CHAMBER

[75] Inventor: William Gilmore, Livermore, Calif.

[73] Assignee: Huntington Mechanical Laboratories, Inc., Mountain View, Calif.

[21] Appl. No.: 697,581

[22] Filed: May 9, 1991

[51] Int. Cl.⁵ .......................... H02K 5/00; H01J 35/10
[52] U.S. Cl. ...................................... 310/88; 118/730; 310/54
[58] Field of Search ............... 118/50.1, 724, 730, 118/715; 219/390, 400; 250/442.1; 310/54, 64, 86, 88, 89, 103, 905; 427/251, 255.5

[56] References Cited

U.S. PATENT DOCUMENTS

| | | | |
|---|---|---|---|
| 4,450,373 | 5/1984 | Miller et al. | 310/89 |
| 4,482,829 | 11/1984 | Tardieu et al. | 310/88 |
| 4,885,946 | 2/1989 | Balter | 74/18.1 |
| 4,885,947 | 3/1989 | Balter | 74/18.1 |
| 4,932,357 | 6/1990 | Tamura et al. | 118/730 |
| 4,945,774 | 8/1990 | Beard et al. | 250/492.2 |
| 5,010,563 | 4/1991 | Laurent et al. | 310/90.5 |

OTHER PUBLICATIONS

Catalog of Huntingdon Mechanical Laboratories, Inc., 1990, p.96, Mountain View, CA.

*Primary Examiner*—Steven L. Stephan
*Assistant Examiner*—D. L. Rebsch
*Attorney, Agent, or Firm*—David Pressman

[57] ABSTRACT

A rotary motion transmitter with an electromagnetic feedthrough device for transmitting rotary motion from the outside to a vacuum chamber (10) designed for treating a specimen in a vacuum environment. The device comprises an evacuated and sealed rotor (14) which contains permanent magnets and, in turn, is hermetically sealed within a capsule (16). The interior of the capsule (16) communicates with the interior of the chamber (10). A removable stator winding unit (22) having electromagnetic windings which interact with the rotor (14) to transmit rotational motion to the rotor is fitted onto the capsule (16). The rotor (14) is rigidly connected to an output shaft (12) which extends into the sealed chamber (10) for supporting and positioning an object to be treated in vacuum. Thus the device combines in itself a rotary feedthrough for transmitting motion to the vacuum chamber (10) and an electric drive motor for positioning an object inside the chamber. This simplifies the construction, reduces its weight, makes it less expensive, protects it from contaminated exterior environments, etc. The transmitter also provides a method for baking the interior of the chamber to evaporate moisture components which are then removed by pumping. For this purpose, the removable stator winding unit (22) is removed and replaced by a cooling jacket (44). This allows baking without dismantling the rotor (14), since its permanent magnets are protected from thermal deterioration by cooling with the surrounding jacket (44).

14 Claims, 2 Drawing Sheets

ROTARY MOTION TRANSMITTER AND HEAT TREATMENT METHOD FOR SEALED CHAMBER

BACKGROUND

1. Field of Invention

The present invention relates to a motion transmitting device, particularly to an electromagnetic device for transmitting rotary motion to a sealed chamber, particularly, a vacuum chamber. The invention also relates to a method of heat treatment, particularly baking the interior of a sealed vacuum chamber.

2. Description of Prior Art

It is often desirable or necessary to rotate objects within a sealed chamber which has a pressure differential with the outside. For instance, when a test specimen, such as a semiconductor wafer, is mounted on a shaft in a chamber, it is often necessary to change the position of the specimen. For this purpose, rotary motion feedthrough mechanisms have been known and used in the past. Specifically, such a mechanism comprises a shaft which extends from inside the sealed chamber to the outside via a rotary feedthrough connection so that the shaft can be rotated from outside of the chamber. The feedthrough connection is an airtight device which retains the pressure differential between the chamber and the outside. Such an arrangement is especially useful where it would be impractical to open the chamber merely to rotate the object.

In those cases where it is necessary to reposition a specimen in a sealed vacuum chamber via a stepper motor under program control, the above-mentioned feedthrough mechanism is used as an intermediate sealed mechanical drive device for transmitting motion from the external stepper motor to a specimen holder located inside the chamber. The provision of the feedthrough mechanism increases the weight of the system as a whole, and makes it more expensive to manufacture. One such feedthrough mechanism is described in page 96, the Catalog of Huntington Mechanical Laboratories, Inc., 1990, p. 96, Mountain View, Calif.

As is known in the art, after assembling and prior to use, a vacuum chamber is normally subjected to a heat treatment procedure known as baking. Baking consists of heating the interior of the chamber to a temperature of up to 450° C., e.g., by infrared lamps located inside the chamber, while the chamber is maintained under vacuum. Baking is necessary for cleaning the interior of the chamber from absorbed gases and other impurities, and especially for evaporating and removing moisture which can adhere to the inner walls of the chamber and which cannot be easily removed by vacuum. Upon completion of baking, the infrared lamps are removed from the chamber, and the chamber is evacuated and sealed.

In case the vacuum chamber is equipped with a motor-driven feedthrough device, baking requires that the electric motor be removed, since, when the temperature exceeds the Curie point, the magnets in the motor may lose their magnetism. Therefore additional time is required for removing the electric motor. (As the feedthrough mechanism itself is sealed by a bellows, it remains hermetically sealed after removal of the motor.) Upon completion of baking, additional time is required for reinstalling the motor in place.

Another essential drawback of feedthrough devices with bellows-type seals is a possibility of occasional rupture or failure of the bellows, e.g., due to fatigue. In case the chamber contains a poisonous material, such as gaseous cyanide used in a technological process inside the chamber, the failure of the bellows will allow the gas to leak to the outside, presenting a serious health problem for personnel.

OBJECTS AND ADVANTAGES

It is accordingly an object of the present invention to eliminate the above disadvantages of conventional devices for transmitting rotary motions to a sealed chamber. Other objects are to provide rotary motion transmitter which combines in itself functions of a stepper motor and a feedthrough mechanism, which is light in weight, simple in construction, inexpensive to manufacture, allows baking without complete dismantling of the motor, and allows cooling of the electric motor rotor during the baking procedure. A further object is to provide a new and efficient method of baking the interior of a vacuum chamber for removing components without dismantling the entire drive motor of a feedthrough device for such a chamber. A still further object is to provide a method of baking which can be carried out quickly and reliably. Another object is to prevent the interior of the chamber from leakage to the surrounding environment in case of unexpected failure of the isolation system.

Yet further objects and advantages will become apparent after consideration of the ensuing description and the accompanying drawings.

BRIEF DESCRIPTION OF THE DRAWINGS

FIG. 1

Detailed Description of Rotary Motion Transmitter

Figure 1:
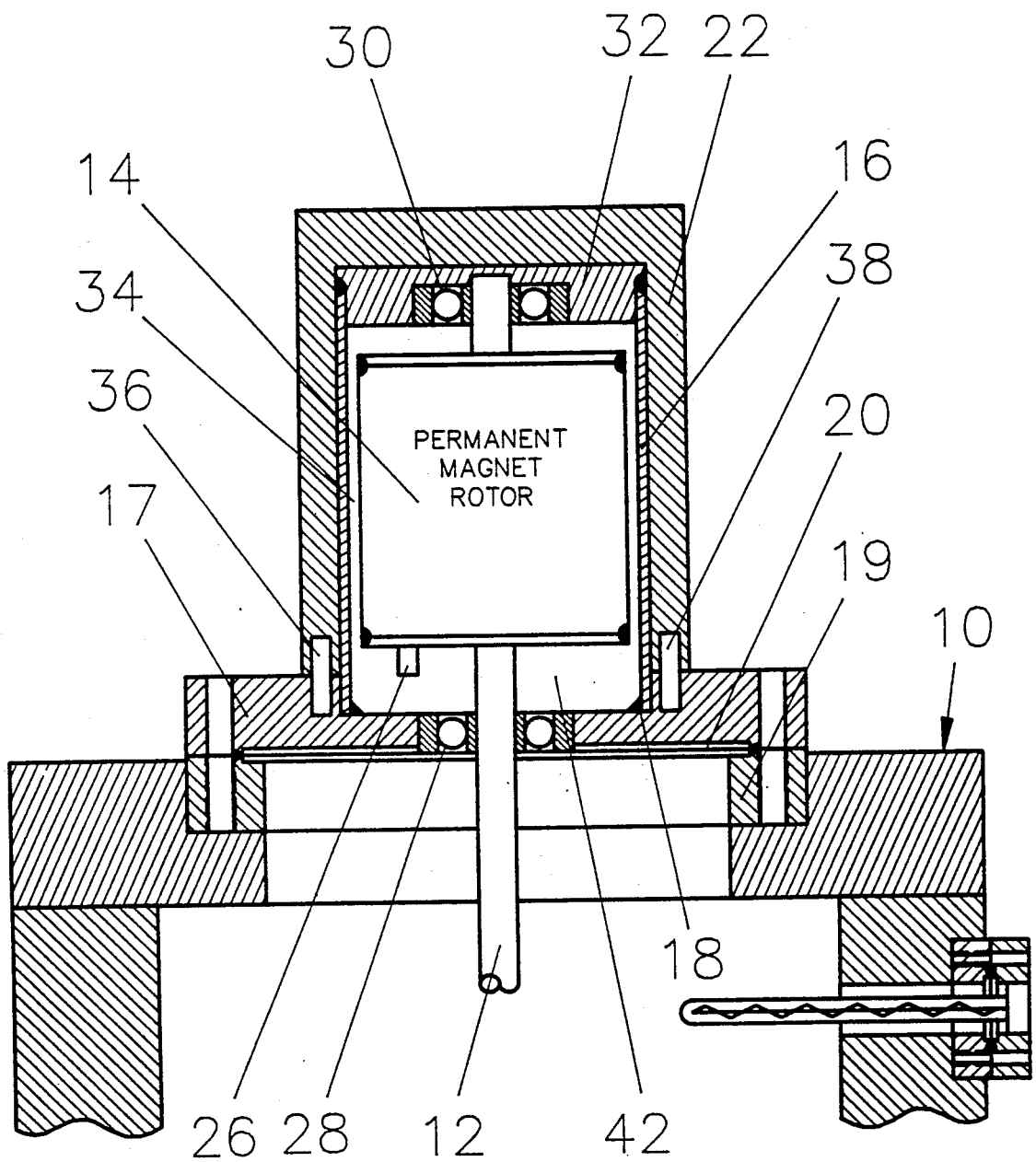
FIG. 1 is a cross-sectional side view of a rotary motion transmitter of the invention for transmitting rotary motion to a sealed chamber.

As shown in FIG. 1, which is a cross-sectional side view, the rotary motion transmitter comprises a sealed vacuum chamber 10 which is used for treating in vacuum a specimen (not shown) which may be supported by a specimen holder (not shown) attached to the end of a shaft 12 located inside vacuum chamber 10.

Shaft 12, which is an output shaft of the transmitter of the invention, can be connected to or made integrally with a rotor 14 which is sealed in a cup-shaped capsule 16 made of a magnetic material, e.g., stainless steel, which has low magnetic permeability. Capsule 16 is airtight and is welded to a mounting flange 17 by a hermetic welding seam 18 formed on the inner side of capsule 16. Flange 17, in turn, is connected to a flange 19 of chamber 10 through a sealing device 20, such as a knife-edge seal commonly used in ultra-high vacuum applications.

Rotor 14 has a conventional construction with permanent magnets which are not shown as the structure of the rotor is beyond the scope of the present invention. The magnets magnetically interact with a rotating magnetic field generated by a stator winding unit 22 which embraces encapsulated rotor 14. In order to prevent contaminants from rotor 14 from reaching the interior of chamber 10, the space inside rotor 14 itself is evacuated through a tube 26 which is then hermetically closed by means of a special pinch tool (not shown).

Thus, rotor 14 is sealed from vacuum chamber 10, while the latter is sealed from the outside by capsule 16.

Rotor 14 is rotatingly supported by front bearings 28 which are located in flange 17 and by rear bearings 30 which are installed in a rear wall 32 of capsule 16.

A small gap 34 of about 50 microns is formed between the outer surface of rotor 14 and the inner surface of capsule 16 to ensure free rotation of rotor 14 while keeping it as close as possible to stator winding unit 22.

Stator winding unit 22 is removable and slidingly fitted onto the outer surface of capsule 16. Accurate positioning of stator winding unit 22 is ensured by locating pins 36 and 38 which are press-fitted into flange 17 and are insertable into respective openings on the facing end of stator winding unit 22. Stator winding unit 22 is attached to flange 19 by mounting bolts (not shown).

Stator winding unit 22 may have a conventional construction of the type used in a conventional brushless stepper motor. The magnetic field generated by windings 22 interacts in a conventional manner with permanent magnets of rotor 14 to cause its rotation. The magnetic field passes through capsule 16 with low, e.g., 30-40%, loss.

Thus the stator and rotor of the transmitter in fact form a brushless electric motor. The rotor is sealed in a capsule 16 whose interior communicates with vacuum chamber 10. The stator is removable and has conventional windings arranged outside the capsule.

A space 42 is sealed by capsule 16 and communicates with the interior of chamber 10.

FIG. 2

Rotary Motion Transmitter with Windings Removed

Figure 2:
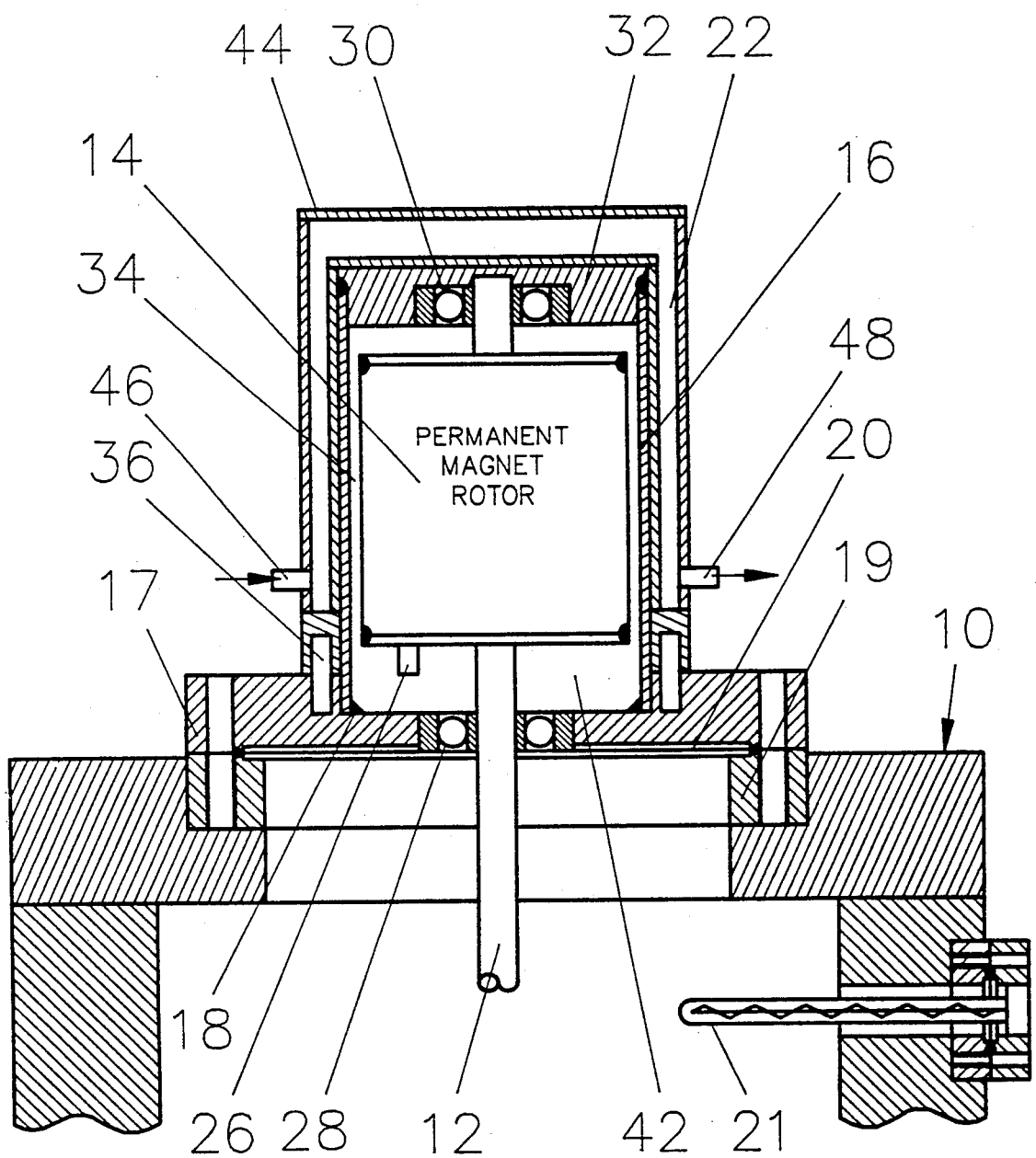
FIG. 2 is a cross-sectional side view of the transmitter with a stator used in such a transmitter replaced by a cooling jacket.

Prior to baking, the mounting bolts (not shown) are disconnected, and stator winding unit 22 is removed from capsule 16 (FIG. 2). In order to protect the permanent magnets of rotor 14 from deterioration because of high temperature developed during baking (up to 450° C.), stator windings 22 are replaced by a cooling jacket 44. Rotor 14 remains in place and the vacuum in gap 34, space 42, and chamber 10 is not violated since hermeticity of the system is ensured by hermetically sealed capsule 16.

Cooling may be carried out by the circulation of water or any other coolant which is admitted into jacket 44 through an inlet port 46 and is discharged through an outlet port 48. Cooling jacket 44 may have the same outer configuration as the stator. The same locating pins 36 and 38 and bolts 40 can be used for the alignment and attachment of cooling jacket 44 to flange 17.

In one specific embodiment stator winding unit 22 had a diameter of 85 mm and an overall length of 100 mm. The transmitter allowed angular positioning of a specimen with an accuracy of 0.9°. It had a total weight of 3.0 kg, while a prior-art transmitter consisting of a rotary feedthrough with an electric drive weighed about 5 kg.

Dismantling of stator winding unit 22 prior to baking and replacement thereof by cooling jacket 44 for baking took only a few minutes.

Assembling Operation.

After rotor 14 is manufactured and prior to assembling it into hermetically sealed capsule 16, the interior of rotor 14 is evacuated through tube 26, and tube 26 is then sealed by pinching with a special pinching tool (not shown). Sealed rotor 14 is installed into cup-shaped capsule 16 so that it is rotatingly supported by bearings 30 with small gap 34 between the outer surface of rotor 14 and the inner surface of capsule 16. Capsule 16 is then welded to flange 17 by ultra-high vacuum weld seam 18. Bearings 28 are installed into flange 17 for rotatingly supporting the front end of rotor 14, i.e., output shaft 12.

Cooling jacket 44 is then placed onto capsule 16 so that pins 38 and 40 are inserted into the openings on the front end of cooling jacket 44, and the jacket is then fixed by bolts 40 to flange 17. The latter, in turn is attached through sealing device 20 to mounting flange 19 of vacuum chamber 10.

Heaters such as infrared lamps 21 (FIG. 2) are preliminarily installed into chamber 10. Chamber 10 is connected to a source of vacuum and while the interior of chamber 10 is maintained under vacuum, it is heated by infrared lamps 21 to a temperature of baking (up to 450° C.) which is sufficient for evaporating moisture contained inside the chamber. Vapors and other impurities are pumped out from chamber 10 by vacuum.

When baking is completed, heat lamps 21 may remain in chamber 10, removable cooling jacket 44 is disconnected from flange 17 and is replaced by removable stator winding unit 22 which is guided onto capsule 16 so that pins 38 and 40 are inserted into the openings on the front end of the stator, and the stator is then fixed by the bolts to flange 17.

A specimen (not shown) is then inserted into chamber 10 via an access port or interlock (not shown) on the other end of chamber 10 and is attached to the end of shaft 12.

The transmitter is now ready for operation.

Operation of the Apparatus

Stator winding unit 22 is energized so as to induce a magnetic field in rotor 14. This rotates rotor 14 through a predetermined angle in accordance with the principle of operation of a conventional stepper motor. As a result, the specimen is placed in the required position, and is then treated in this position in accordance with a predetermined program which controls rotation of rotor 14 and operation of specimen treating instruments (not shown).

Summary, Ramifications, and Scope

Thus it has been shown that the rotary motion transmitter of the invention can transmit rotary motions from outside to within a sealed chamber. The transmitter combines in itself the functions of a stepper motor and a feedthrough mechanism. It is light in weight, simple in construction, inexpensive to manufacture, allows baking without complete dismantling of the motor, and allows cooling of the electric motor rotor during the baking procedure.

It also has been shown that the design of the transmitter provides a quick, inexpensive, efficient, and reliable method of baking the interior of a sealed vacuum chamber without dismantling the entire electromagnetic drive motor and without danger of deteriorating the rotor of the drive motor under the effect of the high temperature developed in baking.

Although the transmitter has been shown and described in the form of a specific embodiment, its parts, materials, and configurations are given only as examples, and many other modifications of transmitters for transmitting rotary motions to a sealed chamber are possible. For examples, the sealed chamber may be pressurized or contain a hazardous substance. Capsule 16 can be made of a material other than stainless steel, provided this material has low magnetic permeability. Means other than bolts 40 can be used for locking removable stator unit 22 in place. The interior of cooling jacket 44 can be cooled by a cooling coil rather than by circulating liquid or gaseous coolant. The interior of the vacuum chamber can be heated by heaters other than infrared lamps. The specimen can be subjected to different treatments, such as ion implantation, etc. If necessary, a specimen can be treated mechanically or machined by tools attached to shaft 12 which may hold a drill. When such a drill is rotated, the specimen can be fed toward the drill for drilling a hole, etc. Many other applications are possible. Therefore, the scope of the invention should be determined, not by examples given, but by the appended claims and their legal equivalents.

What I claim is:

1. A method of baking the interior of a sealed vacuum chamber equipped with an electromagnetic feedthrough device for transmitting rotation from the outside to said sealed vacuum chamber, comprising the steps of:

providing said chamber with a portion which extends outwardly from the rest of said chamber;

providing said feedthrough device in the form of an electric motor having a sealed rotor located in said portion and a stator located on the outside of said portion, but capable of interacting with said rotor for causing its rotation, said stator being removable from said portion;

placing into said chamber means for heating the interior of said chamber to a temperature sufficient to evaporate any vapor components therein;

removing said stator from said portion and replacing it with means for cooling said rotor;

connecting said interior of said chamber to a source of vacuum; and heating said interior of said chamber by said heating means while removing said vapors by pumping out said vacuum system.

2. The method of claim 1 wherein said heating means are infrared lamps.

3. The method of claim 2 wherein said motor is a brushless electric motor, said rotor has permanent magnets, and said removable stator has windings interacting with said magnets through said portion.

4. The method of claim 3 wherein said portion comprises a hermetically sealed capsule, the interior of which communicates with the interior of said sealed chamber;

said rotor is rigidly connected to an output shaft which extends into said sealed chamber for supporting and positioning an object to be treated in vacuum;

said rotor with said output shaft is rotatingly supported within said capsule by bearings located within said vacuum.

5. The method of claim 4 wherein said chamber has a first flange, said portion is a cup-shaped sealed capsule which has a second flange which can be sealed to said first flange so that the interior of said capsule will communicate with the vacuum of said sealed chamber, but will be hermetically sealed against the surrounding space.

6. The method of claim 5 the interior of said rotor is evacuated and is sealed against said vacuum.

7. The method of claim 6 wherein said rotor has a pinch tube which is used for evacuating air from said rotor and which is sealed by pinching after said evacuation.

8. An electromagnetic feedthrough device for transmitting rotary motion from the outside to the interior of a sealed vacuum chamber, comprising:

a sealed vacuum chamber for treating a specimen in a vacuum;

a brushless electric motor having a rotor with permanent magnets which is hermetically sealed within a capsule, the interior of which communicates with the interior of said sealed chamber;

a removable stator with windings positioned to electromagnetically interact with said rotor to transmit rotational motion to said rotor;

an output shaft which is rigidly connected to said rotor and extends into said sealed chamber for supporting and positioning an object to be treated in vacuum; and a cooling jacket which can be installed onto said capsule instead of said removable stator for cooling said rotor and its magnets during heat treatment of the interior of said chamber.

9. The electromagnetic feedthrough device of claim 8 wherein said rotor is rotatingly supported within said capsule by bearings located with said sealed vacuum chamber.

10. The electromagnetic feedthrough device of claim 8 wherein said chamber has a first flange, said capsule has a second flange which can be sealingly connected to said first flange so that the interior of said capsule will communicate with the vacuum of said sealed chamber, but will be hermetically sealed against the surrounding space, said rotor being sealed against said vacuum.

11. The electromagnetic feedthrough device of claim 10 wherein said rotor has a pinch tube which is used for evacuation of air from said rotor and which has been sealed by pinching after evacuation of air from the interior of said rotor.

12. The electromagnetic feedthrough device of claim 12 wherein said rotor is rotatingly supported within said capsule by two bearings, one of said two bearings is installed in said capsule while the other one of said two bearings is installed in said first flange.

13. A rotary motion for transmitting rotary motion to a sealed chamber, comprising, a sealed chamber for treating a specimen;

a capsule, the interior of which communicates with the interior of said chamber;

a rotor hermetically sealed within said capsule and having means for rotatingly supporting said rotor in said capsule;

a removable stator positioned to electromagnetically interact with said seled rotor to transmit rotation motion to said rotor;

an output shaft which is rigidly connected to said rotor and extends into said sealed chamber for supporting and positioned an object to be treated in said chamber;

said sealed chamber being maintained under vacuum, said rotor having permanent magnets, and said means rotatingly supporting said rotor comprising at least one bearing located within said capsule, the interior of said rotor being evacuated and sealed against the vacuum of said capsule and said chamber.

14. A rotary motion transmitter for transmitting rotary motion to a sealed chamber comprising:

a sealed chamber for treating a specimen;

a capsule, the interior of said capsule communicating with the interior of said chamber;

a rotor hermetically sealed within said capsule and having means for rotatingly supporting said rotor in said capsule;

a removable stator positioned to electromagnetically interact with said sealed rotor to transmit rotational motion to said rotor;

an output shaft which is rigidly connected to said rotor and extends into said sealed chamber for supporting and positioning an object to be treated in said chamber;

said sealed chamber being maintained under vacuum, said rotor having permanent magnets, and said means rotatingly supporting said rotor comprising at least one bearing located within said capsule, said rotor having a pinch tube which has been pinched after evacuation of air from the interior of said rotor.

* * * * *